US 9,209,068 B2

(12) United States Patent
Moriceau et al.

(10) Patent No.: US 9,209,068 B2
(45) Date of Patent: Dec. 8, 2015

(54) METHOD FOR THE TREATMENT AND DIRECT BONDING OF A MATERIAL LAYER

(71) Applicant: Commissariat a l'energie atomique et aux ene alt, Paris (FR)

(72) Inventors: Hubert Moriceau, Saint-Egreve (FR); Franck Fournel, Villard-Bonnot (FR); Christophe Morales, St Pierre de Mesage (FR); Caroline Rauer, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 16 days.

(21) Appl. No.: 14/353,883

(22) PCT Filed: Oct. 24, 2012

(86) PCT No.: PCT/EP2012/071067
§ 371 (c)(1),
(2) Date: Apr. 24, 2014

(87) PCT Pub. No.: WO2013/060729
PCT Pub. Date: May 2, 2013

(65) Prior Publication Data
US 2015/0194337 A1 Jul. 9, 2015

(30) Foreign Application Priority Data
Oct. 26, 2011 (FR) ...................................... 11 59722

(51) Int. Cl.
*H01L 21/30* (2006.01)
*H01L 21/46* (2006.01)
(Continued)

(52) U.S. Cl.
CPC .... *H01L 21/76251* (2013.01); *H01L 21/02164* (2013.01); *H01L 21/02238* (2013.01);
(Continued)

(58) Field of Classification Search
CPC .............. H01L 21/187; H01L 21/3105; H01L 21/02216; H01L 21/02255; H01L 21/023591; H01L 21/28185; H01L 21/2007; H01L 21/02332; H01L 21/02126; H01L 21/31658; H01L 23/345; H01L 23/488
USPC ......... 438/455, 406, 118, 121, 125, 508, 509, 438/513, 474, 789; 257/E21.006, E21.077, 257/E21.114, E21.17, E21.229, E21.267, 257/E21.304, E21.311, E21.324, E21.479, 257/E21.483, E21.509, E21.512
See application file for complete search history.

(56) References Cited

U.S. PATENT DOCUMENTS 5,383,993 A * 1/1995 Katada et al. .................. 156/153
9,025,095 B2 * 5/2015 Rossini et al. .................. 349/18
(Continued)

FOREIGN PATENT DOCUMENTS

| EP | 1 381 086 | 1/2004 |
|---|---|---|
| FR | 2 868 599 | 10/2005 |
| FR | 2 912 839 | 8/2008 |

OTHER PUBLICATIONS

U.S. Appl. No. 14/324,379, filed Jul. 7, 2014, Le Prado, et al.
(Continued)

*Primary Examiner* — David Nhu
(74) *Attorney, Agent, or Firm* — Oblon, McClelland, Maier & Neustadt, L.L.P.

(57) ABSTRACT

A method for treating at least one first material layer including siloxane bonds, wherein at least one surface can be interlocked with a surface of a second material layer by direct bonding, the method including: at least one forced diffusion at a temperature greater than or equal to 30° C., at least in the first material layer, of chemical species including at least one pair of free electrons and at least one labile proton; and converting at least one portion of the siloxane bonds into silanol bonds in at least one portion of the first material layer extending from the surface to a depth greater than or equal to approximately 10 nm.

13 Claims, 3 Drawing Sheets

(51) Int. Cl.
*H01L 21/762* (2006.01)
*H01L 21/20* (2006.01)
*H01L 21/3105* (2006.01)
*H01L 21/02* (2006.01)
*H01L 21/223* (2006.01)
*H01L 21/228* (2006.01)
*H01L 21/306* (2006.01)

(52) U.S. Cl.
CPC .......... *H01L21/2007* (2013.01); *H01L 21/223* (2013.01); *H01L 21/228* (2013.01); *H01L 21/30625* (2013.01); *H01L 21/3105* (2013.01)

(56) References Cited

U.S. PATENT DOCUMENTS

| | | | |
|---|---|---|---|
| 9,064,783 B2 * | 6/2015 | Sabbione et al. | |
| 2004/0035525 A1 | 2/2004 | Yokokawa et al. | |
| 2004/0126993 A1 | 7/2004 | Chan et al. | |
| 2005/0218111 A1 | 10/2005 | Maleville et al. | |
| 2006/0194414 A1 | 8/2006 | Chan et al. | |
| 2006/0273068 A1 | 12/2006 | Maunand Tussot et al. | |
| 2008/0200008 A1 | 8/2008 | Kerdiles et al. | |
| 2008/0227270 A1 | 9/2008 | Chan et al. | |
| 2010/0093152 A1 | 4/2010 | Kerdiles et al. | |

OTHER PUBLICATIONS

International Search Report Issued Jan. 21, 2013, in PCT/EP12/071067 Filed Oct. 24, 2012.

French Search Report Issued Jul. 18, 2012 in French Patent Application No. 1159722 Filed Oct. 26, 2011.

U.S. Appl. No. 14/354,402, filed Apr. 25, 2014, Sabbione, et al.

French Preliminary Search Report issued Jul. 23, 2012 in Patent Application No. 1159722 (with English translation of categories of cited documents).

* cited by examiner

METHOD FOR THE TREATMENT AND DIRECT BONDING OF A MATERIAL LAYER

FIELD OF THE INVENTION

The invention relates to the field of direct bonding, and notably a treatment method suitable for increasing the surface energy of at least one material layer, advantageously comprising silicon oxide, intended to be interlocked with a second material layer using direct bonding between these two layers.

The invention also relates to a method for interlocking by means of direct bonding a first material layer having undergone such a treatment method with a second material layer.

STATE OF THE RELATED ART

Direct bonding, also known as molecular bonding or molecular adhesion, consists of interlocking two material surfaces against each other without an intermediate adhesive layer between the two surfaces. In this type of bonding, adhesion is obtained due to the fact that the surfaces to be bonded are sufficiently smooth (typically with roughness less than approximately 6 nm RMS), free from particles or contaminations, and brought close together such that electronic interactive forces of attraction between the atoms or molecules of both surfaces to be bonded are created, for example Van der Waals forces, at ambient temperature and pressure. Heat treatments may be carried out during or after bonding to increase the bonding energy between the joined surfaces.

Such direct bonding is used in numerous applications notably for bonding oxide layers obtained by means of deposition.

As such, when two elements, for example substrates comprising semiconductor, to be interlocked have surface topologies, it is possible to deposit an oxide layer on these topologies, and then perform planarisation of these deposited oxides. In this way, it is possible to obtain plane surfaces, wherein the topology has been smoothed, suitable for being bonded by direct bonding against each other.

The oxide layers used for such direct bonding are generally obtained by means of PECVD (plasma-enhance chemical vapour deposition) type $SiO_2$ depositions. One of the advantages of these depositions is that they are carried out at a relatively low temperature (for example approximately 380° C.), making it possible not to damage components, or depositions of other materials, made on the surface of the elements to be interlocked, particularly by avoiding inducing stress related to the differences in heat expansion coefficients of the materials present on or in these elements.

A problem commonly encountered when seeking to carry out such direct bonding is that the bonding energy, obtained via the electronic interactive forces of attraction between the atoms or molecules of the two surfaces to be bonded and equivalent to the sum of the surface energies of each of the two surfaces, is insufficient for the envisaged application (for example, this bonding energy may be less than 2 $J/m^2$ after a heat treatment at 200° C. for 2 hours), despite prior planarisation of the surfaces. Indeed, if the bonding energies obtained are compared to cleaned thermal oxides, bonded and heat-treated for 2 hours at 200° C., and the bonding energies obtained with planarised thermal oxides, bonded and heat-treated for 2 hours at 200° C., the latter may be three to four times greater (typically equal to 2 $J/m^2$, compared to approximately 0.6 $J/m^2$ without planarisation).

The value of the bonding energy between two substrates and that of the surface energy deduced therefrom may be determined, after a prior heat treatment at approximately 200° C. for approximately 2 hours, by inserting a blade having a thickness approximately equal to 600 µm between the two bonded substrates (according to Maszara's technique) at the bevel thereof, in a clean room atmosphere, with a humidity level in the region of 40% and at an ambient temperature in the region of 20° C.

The planarisation method (also known as chemical-mechanical polishing method or chemical-mechanical planarisation, or CMP) is a smoothing method simultaneously performing a surface activation. CMP typically consists of smoothing surfaces (for example comprising oxide) by rubbing these surfaces with a polishing "cloth" in the presence of a liquid, or "slurry", charged with abrasives, for a time for example between approximately 10 seconds and 1 minute. The typical abrasion rates for layers of $SiO_2$ deposited by PECVD are in the region of 0.2 to 0.3 µm/min. Such planarisation is suitable for leaving favourable chemical bonds on the surface of layers for subsequent direct bonding between these layers.

However, for the majority of oxides deposited, wherein the thickness is for example in the region of approximately 1 µm, planarised (smoothed) and intended to be bonded by molecular adhesion, CMP is not suitable for obtaining bonding energies greater than approximately 2 $J/m^2$, i.e. a surface energy equal to approximately 1 $J/m^2$, while the stacked structure has undergone a heat treatment for 2 hours at approximately 200° C. However, for some applications, it may be necessary to obtain a greater bonding energy.

Various approaches have been tried to increase the bonding energy, of which mention may be made of plasma surface treatments (for example in oxygen or in nitrogen). The bonding energies obtained for bonds of two oxide surfaces, for example equal to approximately 1 µm in thickness, after heat treatments for approximately 2 hours at 200° C., are scarcely greater than approximately 2 $J/m^2$.

DESCRIPTION OF THE INVENTION

One aim of the present invention is that of providing a method suitable for increasing the surface energy of at least one first material layer, for example comprising silicon oxide, and intended to be interlocked with a second material layer by direct bonding, and thus increasing the bonding energy between the surfaces of these two layers of material when they are subsequently interlocked with each other by direct bonding.

For this, the present invention relates to a method for treating at least one first material layer comprising siloxane bonds wherein at least one surface is intended to be interlocked with a surface of a second material layer by direct bonding, comprising at least one forced diffusion step, at least in the first material layer, of chemical species comprising at least one pair of free electrons and at least one labile proton, converting at least one portion of the siloxane bonds into silanol bonds in at least one portion of the first material layer extending from said surface to a depth greater than or equal to approximately 10 nm.

The chemical species comprising a pair of free electrons are also known as "Lewis bases". The chemical species comprising at least one labile proton are also known as "Brönsted acids", and refer to any chemical species liable to release one or a plurality of protons during an acid-base reaction. A chemical species comprises a labile proton when it exhibits acidity, i.e. there is a pKa for this species. All the species wherein the pKa is for example between 1 and 14 thus comprise at least one labile proton.

The expression "forced diffusion" means that the chemical species penetrate the material and interact with the material on the surface thereof (surface intended to be bonded with the second material layer) and in a portion of the volume of the layer situated under this surface to a depth of at least 10 nm below this surface (or a depth of at least 20 nm or 50 nm), without degrading the surface condition of the material for example by etching. This forced diffusion may be obtained at a temperature greater than ambient temperature, for example greater than approximately 30° C., for a time increasing in length according to how low the temperature is. This forced diffusion of the molecules is not obtained using mere rinsing, for example with water, since the water temperature and the rinsing time are insufficient to be suitable for modifying the material in depth (for at least 10 nm below the surface to be interlocked). This forced diffusion may be implemented at a temperature greater than or equal to approximately 30° C. and/or at a pressure greater than atmospheric pressure.

Preferentially, to promote the mechanism for converting siloxane bonds in silanol bonds, the diffused chemical species may be chosen such that the distance between the base and the acid of the chemical species (corresponding for example to the O—H distance for water) is in the order of magnitude of a Si—O bond, i.e. for example between approximately 0.1 nm and 0.6 nm. For example, water molecules meet this criterion, with a base-acid distance equal to 0.16 nm.

This method is suitable for obtaining without delay (for example in less than 24 hours) a surface energy greater than approximately 1 $J/m^2$, or even greater than or equal to approximately 1.3 $J/m^2$, which is conveyed by a bonding energy greater than approximately 2 $J/m^2$ or greater than or equal to approximately 2.5 $J/m^2$ when the first layer is interlocked with the second layer by direct bonding and after a heat treatment at approximately 200° C. for approximately 2 hours.

This method is advantageously used for a first layer comprising $SiO_x$ (where x is such that 1<x<3) deposited by PECVD using TEOS (Tetraethoxysilane) type precursors and oxygen, such a first layer having a tendency to be charged with water after deposition.

The first layer may comprise silicon oxide according to the formula $SiO_2$. The method according to the invention also relates to layers comprising silicon oxide having a non-stoichiometric composition according to the formula $SiO_x$ where 1<x<3 and advantageously 1.5<x<2.5, and more generally oxides according to the general formula $SiO_xN_yC_z$ (where x is not zero, and y and z may be zero), quartz, silica, glass, all these materials optionally being doped for example with phosphorus, boron or potassium.

The invention thus relates to any materials comprising siloxane bonds (Si—O—Si type bonds between silicon atoms and oxygen atoms).

Direct bonds using such materials are hydrophilic bonds since they relate to the adhesion of hydrophilic surfaces, i.e. surfaces having potential to bind with water (by means of an adsorption mechanism).

Silanol bonds consist of bonds according to the formula Si—OH.

The forced diffusion step may comprise dipping of the first material layer in a liquid comprising the chemical species.

The liquid may be water and be heated to a temperature greater than or equal to approximately 30° C. At a temperature of approximately 30° C., the treatment time may be greater than approximately 24 hours to be suitable for converting the siloxane bonds into silanol bonds along a depth of at least 10 nm below the layer surface. The higher the temperature of the liquid, the more time of the treatment carrying out the forced diffusion will be reduced. For example, at a temperature equal to approximately 50° C., approximately 12 hours may suffice to carry out this chemical bonds conversion in the layer. Heating the liquid may accelerate the diffusion of the chemical species from the liquid into the layer undergoing the treatment.

Advantageously, when dipping the first material layer in the liquid, the liquid may be water and be heated to a temperature greater than or equal to approximately 70° C., the first material layer optionally being dipped in the liquid for a time greater than or equal to approximately 1 hour. In this way, in the first layer, a surface energy greater than approximately 1 $J/m^2$ is obtained without delay, this energy being suitable for reaching, for example after 10 hours of treatment, a value greater than approximately 1.2 $J/m^2$.

Alternatively, the forced diffusion step may comprise exposure of the first material layer to an atmosphere comprising the chemical species in gaseous form, for example at a temperature greater than ambient temperature, or for example greater than approximately 50° C.

The atmosphere may be enriched with water and comprise for example a humidity level greater than or equal to approximately 70%. The exposure may be carried out at a temperature greater than approximately 50° C.

The forced diffusion step may be implemented at a pressure greater than atmospheric pressure.

The forced diffusion step may comprise dipping of the first material layer in a liquid comprising the chemical species and heated to a temperature greater than or equal to 100° C.

As a general rule, the forced diffusion step may be implemented at a temperature greater than or equal to approximately 30° C.

The diffused chemical species may for example comprise molecules such as $H_2O$ and/or $N_2H_4$ (hydrazine) and/or $NH_4OH$ (ammonia). These chemical species are suitable for converting siloxane bonds into silanol bonds. Further chemical species may be used for converting siloxane bonds into silanol bonds.

The material of the first layer may be an oxide obtained using a deposition on a substrate comprising semiconductor or a thermal oxidation of said substrate.

The invention also relates to a method for interlocking at least one first material layer comprising siloxane bonds against at least one second material layer, comprising at least steps for:
  using a method for treating at least one first material layer as defined above;
  direct bonding of the first material layer against the second material layer.

The interlocking method may further comprise a chemical-mechanical planarisation step, for example CMP, of the surfaces of the first and second material layer intended to be placed in contact against each other during the direct bonding, carried out before the direct bonding step. This planarisation may be carried out before or after the forced diffusion step.

Advantageously, the second material layer may also comprise siloxane bonds and the method may further comprise the use of a method for treating the second material layer as defined above, under identical or different conditions (in terms of chemical species and/or temperature and/or time) in relation to those of the treatment applied to the first layer. As such, the two layers interlocked with each other by direct bonding are previously treated by forced diffusion of chemical species so as to increase the surface energies of the two material layers, increasing the bonding energy obtained for the direct bonding of these two layers against each other accordingly.

BRIEF DESCRIPTION OF THE FIGURES

The present invention will be understood more clearly on reading the description of examples of embodiments given merely as an indication and in no way as a limitation with reference to the appended figures wherein.

Identical, similar or equivalent parts of the various figures described hereinafter bear the same reference numbers for easier transition from one figure to another.

The various parts shown in the figures are not necessarily represented on a uniform scale, to render the figures more legible.

The various options (alternatives and embodiments) should be understood as not being mutually exclusive and may be combined with each other.

DETAILED DESCRIPTION OF PARTICULAR EMBODIMENTS

Reference is made to FIGS. 1 to 4 representing the steps of a direct bonding method comprising the use of a treatment method according to one particular embodiment, increasing the bonding energy involved during this bonding.

In the method described herein, a first silicon substrate 102 is interlocked with a second silicon substrate 114 via oxide layers, for example comprising $SiO_x$, produced on these two substrates 102, 114 and bonded by molecular adhesion against each other.

Figure 1:
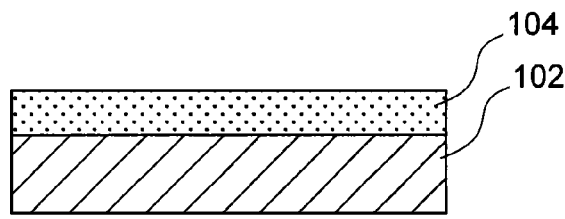
FIGS. 1 to 4 represent the steps of a method for interlocking, by direct bonding, two material layers, according to the present invention, according to one particular embodiment.

As shown in FIG. 1, a layer of $SiO_x$ 104 is produced, for example by means of PECVD, on one face of the substrate 102. This layer of $SiO_x$ 104 is intended to be situated facing the second substrate 114 during the direct bonding.

Figure 2A:
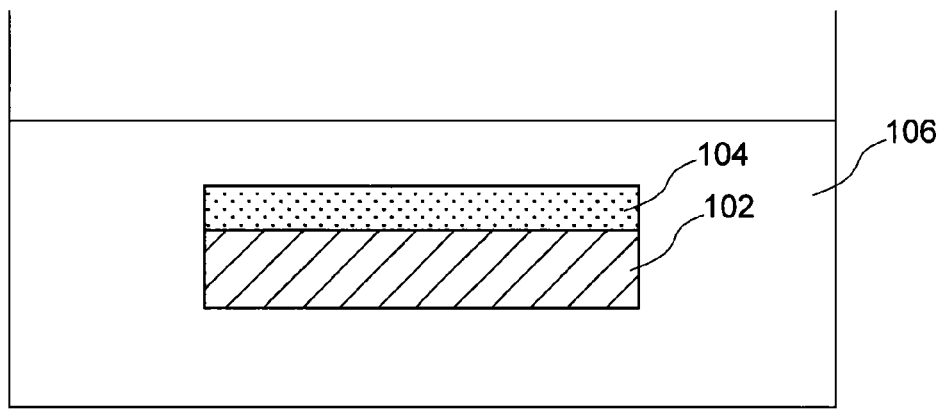

A treatment is then applied for increasing the surface energy exhibited by the layer of $SiO_x$ 104 during the direct bonding. For this, forced water diffusion is carried out in the layer of $SiO_x$ 104. As shown in FIG. 2A, this forced diffusion is for example obtained by dipping the oxide layer 104 (and the first substrate 102) in a water tank 106 heated to a temperature greater than ambient temperature, for example greater than or equal to approximately 30° C. and advantageously between approximately 70° C. and 90° C.

On increasing the surface energy of the layer of $SiO_x$ 104, this energy increases until it reaches a high value, for example equal to approximately 1.3 $J/m^2$ for the $SiO_x$ of the layer 104. This high value is dependent on the deposition parameters and/or the nature of the material of the layer 104, and/or the thickness of the layer 104 if this thickness is less than approximately 0.5 μm. For a surface energy of the layer 104 of a given value, the dipping time of the layer 104 in water required to attain this surface energy value increases in length as the water temperature decreases. As such, dipping the oxide layer 104 in water heated to approximately 90° C. for approximately 7 hours is suitable for obtaining the same surface energy of the layer 104 as dipping the layer 104 in water heated to approximately 70° C. for approximately 10 hours.

Figure 5:
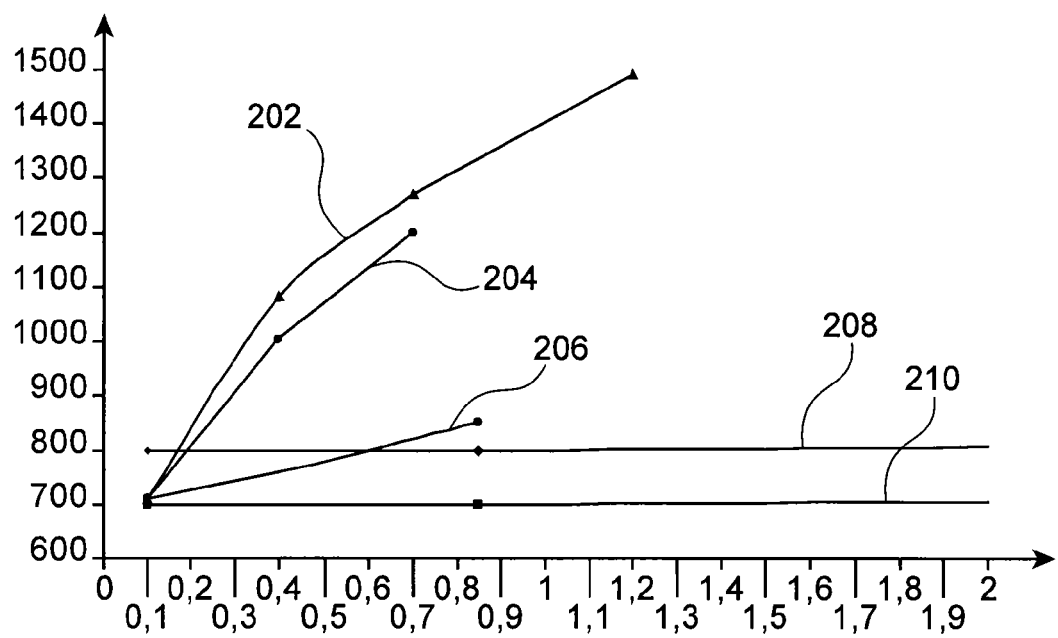
FIGS. 5 and 6 represent surface energy measurements obtained using a treatment method, according to the present invention, according to various alternative embodiments.

By way of illustration, the curves shown in FIG. 5 correspond to the surface energy values (in $mJ/m^2$ on the y-axis) obtained in the layer 104 for dipping in water heated to various temperatures, according to the dipping time (indicated as a number of days on the y-axis).

As such, the curve 202 represents the surface energy obtained in the layer 104, according to the dipping time of this layer 104, in water heated to approximately 90° C. The curve 204 represents the surface energy obtained for dipping the layer 104 in water heated to approximately 70° C. It is noted that the energy increase effect increases in speed as the temperature increases once a certain "saturation" of the material is not reached. As such, at approximately 0.4 days, the difference between the curves 202 and 204 is greater than at approximately 0.7 days. By way of comparison, the curve 206 represents the surface energy obtained for dipping the layer 104 in water at approximately 20° C. Finally, the curves 208 and 210 respectively represent the high and low values of the surface energy of the oxide layer 104 when left in the ambient air for an equivalent time.

It is thus seen in these curves that the forced water diffusion treatment in the oxide layer 104 is suitable for rapidly increasing the surface energy value of the treated layer. From 5 hours of dipping in water heated to approximately 90° C. (or 9 hours in water heated to approximately 70° C.), the layer 104 already has a surface energy greater than approximately 1 $J/m^2$. By dipping the layer 104 in water at 20° C., such a surface energy of 1 $J/m^2$ could only be attained after 2 days, which is not compatible for a method intended for industrial use. By dipping the layer 104 in water heated to approximately 50° C., a surface energy greater than approximately 1 $J/m^2$ can be attained in less than one day (for example, approximately 18 hours).

Figure 6:
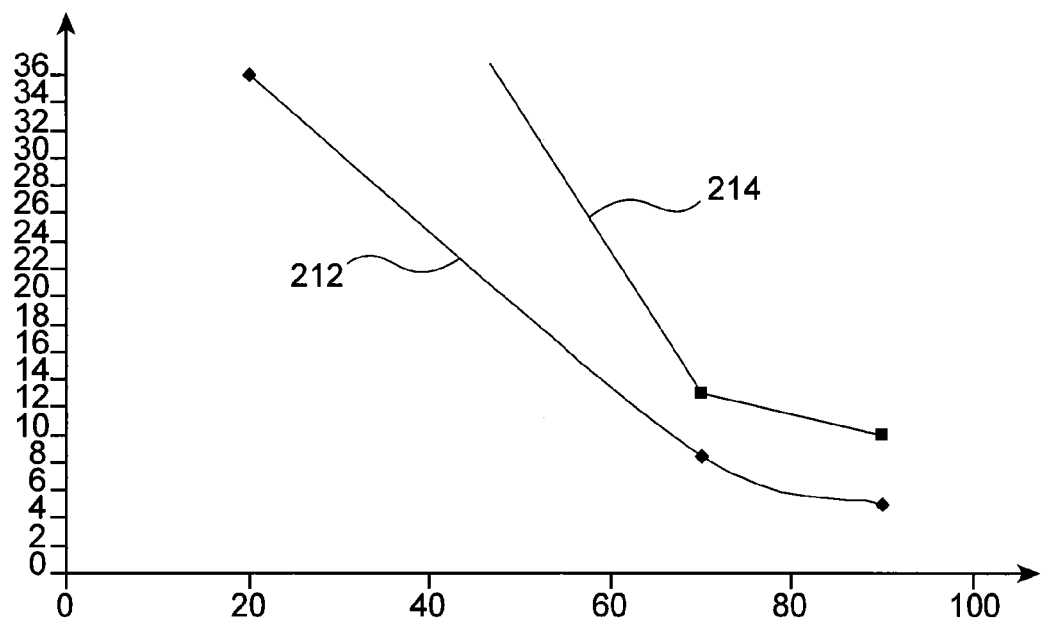

Dipping in water heated to approximately 70° C. for less than 24 hours, for example approximately 18 hours, is suitable for obtaining a surface energy at least equal to approximately 1.2 $J/m^2$, i.e. a value close to the maximum value suitable for being attained. This time is reduced to approximately 10 hours if the water temperature is in the region of 90° C. The curves 212 and 214 shown in FIG. 6 represent dipping times (as a number of hours on the y-axis) required to obtain a surface energy respectively equal to 1 $J/m^2$ and 1.2 $J/m^2$ according to the temperature of the water (in ° C. on the x-axis) wherein the oxide layer 104 is dipped.

Figure 2B:
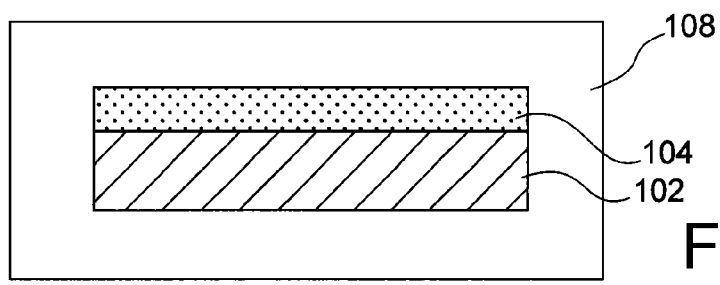

Alternatively, the forced diffusion of water in the oxide of the layer 104 may be obtained by subjecting the oxide layer 104 to an atmosphere having a humidity level greater than approximately 70% and at a temperature greater than approximately 50° C., or 70° C. As shown in FIG. 2B, the oxide layer 104 and the first substrate 102 may be arranged in a closed chamber subject to such an atmosphere 108.

The forced diffusion of water in the oxide layer 104, obtained by dipping the layer 104 in liquid water or exposing the layer 104 to an atmosphere having a high humidity level, may be carried out advantageously at a pressure greater than atmospheric pressure, for example between 1 and 100 bar. Like the heating temperature of the liquid wherein the oxide layer 104 is dipped or the humidity level to which the oxide layer 104 is exposed, the pressure is a parameter suitable for accelerating the diffusion of chemical species in the layer 104. Finally, this pressure greater than the atmospheric pressure is also suitable, in a further alternative, for heating the water to a temperature greater than 100° C., further reducing the treatment time for increasing the surface energy of the oxide layer 104.

As a general rule, the parameters (temperature, time, pressure, etc.) of the forced diffusion operation of chemical species in a material are adapted according to the nature of the material undergoing this forced diffusion and the techniques used for producing this material to obtain the bonding energy sought under satisfactory conditions for the application (notably in terms of time). To reduce the treatment time, the temperature and/or pressure may for example be increased. Calibration steps of the method may be performed by those skilled in the art to determine the optimal conditions for the material and the envisaged application.

Figure 3:
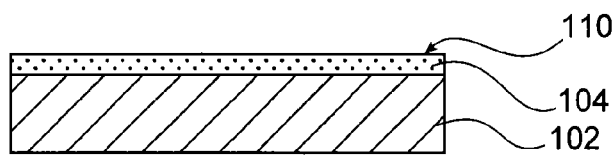

As shown in FIG. 3, after carrying out the forced diffusion treatment of chemical species in the oxide layer 104, chemical-mechanical planarisation (CMP) of the layer 104 may be carried out, suitable for reducing the roughness of the upper surface 110 (surface opposite that in contact with the first substrate 102) of the layer of $SiO_x$ 104 and thus rendering same compatible with the use of direct bonding if required. A roughness less than or equal to approximately 1 nm RMS or 0.6 nm RMS is advantageous for a silicon oxide surface in order to facilitate bonding. This CMP step also increases the surface energy of the oxide layer 104, notably on the upper surface 110 thereof. This CMP step may be carried out so as to only remove a material thickness less than that wherein the operation for converting siloxanes into silanols was performed to retain at least 5 nm, or 10 nm or more, of this material thickness.

In one alternative, it is possible to carry out this planarisation step before implementing the forced diffusion treatment of chemical species in the oxide layer 104.

An optional cleaning step may also be carried out at this stage, immediately prior to the contacting of the surfaces, notably to remove hydrocarbons (for example by means of CARO type treatment or by means of UV Ozone treatment) or to remove any particles present on the surface (for example by means of SC1 etching in an RCA bath $NH_4OH:H_2O_2:H_2O$, typically in proportions [(0.1-1):(1):(1-100)].

Figure 4:
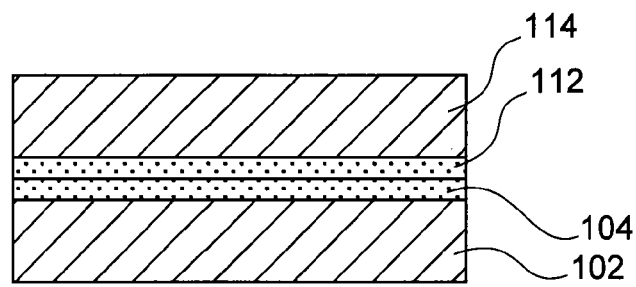

Finally, as shown in FIG. 4, hydrophilic direct bonding is then carried out by molecular adhesion between the surface 110 of the layer of $SiO_x$ 104 and a surface of a second layer 112, for example comprising $SiO_x$ and interlocked with the second silicon substrate 114.

A bond strengthening heat treatment may be carried out during or after the contacting step. In the examples described herein, a treatment at approximately 200° C. for approximately 2 hours is carried out. However, it may consist of a treatment at a higher temperature, for example greater than or equal to approximately 500° C., or even greater than or equal to approximately 800° C., according to the applications and bonding energies sought.

In order to increase the bonding energy between the two layers 104 and 112, the second oxide layer 112 may also be subjected to a forced diffusion of chemical species carried out for example in a manner equivalent to that described above for the oxide layer 104.

Alternatively, the two layers 104 and 112 may be treated differently. For example, the bonding of a layer of $SiO_x$ dipped in water at approximately 90° C. for approximately 14 hours with a layer of thermal oxide dipped in water at approximately 70° C. for approximately 7 hours would be suitable for obtaining, after a heat treatment at approximately 200° C. for 2 hours, a bonding energy greater than 2.5 $J/m^2$.

In an alternative embodiment of the treatment method described above, the $H_2O$ water molecules diffused in the layer 104 may be replaced by further chemical species, present in a liquid in the case of a dipping treatment of the layer or in gaseous form in the case of a treatment by exposing the layer in a gaseous atmosphere, also suitable for increasing the surface energy of the layer 104. Such chemical species consist of those which are both a Lewis base (i.e. comprising at least one pair of free electrons) and a Brönsted acid (i.e. comprising at least one labile proton). These species may advantageously be such that the distance between the acid and the base of these chemical species is of the same order of magnitude as that of a Si—O bond, i.e. between approximately 0.1 nm and 0.6 nm. It is for example possible to diffuse hydrazine ($N_2H_4$) or ammonia ($NH_4OH$) molecules in the layer 104 in order to increase the surface energy thereof.

Although the direct bonding method is described above for bonding $SiO_x$—$SiO_x$ deposited layers, the treatment consisting of the forced diffusion of water molecules (or further chemical species as described above) in a material layer for increasing the surface energy thereof may also be carried out for thermal oxides, or any silicon oxide according to the general formula $SiO_xN_yC_z$ (where x is not zero), glass, silica, quartz or more generally any material comprising siloxane bonds (Si—O—Si type bonds between silicon and oxygen atoms).

The forced diffusion of water obtained may be characterised by carrying out an infrared characterisation of the treated layer, for example by means of ATR-FTIR spectroscopy, in a range between approximately 3000 and 3800 $cm^{-1}$ of the OH band. The curves 216 and 218 represent the absorbance (in arbitrary units on the y-axis) of the oxide layer 104 according to the wave number (in $cm^{-1}$ on the x-axis) respectively immediately after depositing the oxide and after extensive water diffusion in the layer 104.

Figure 7:
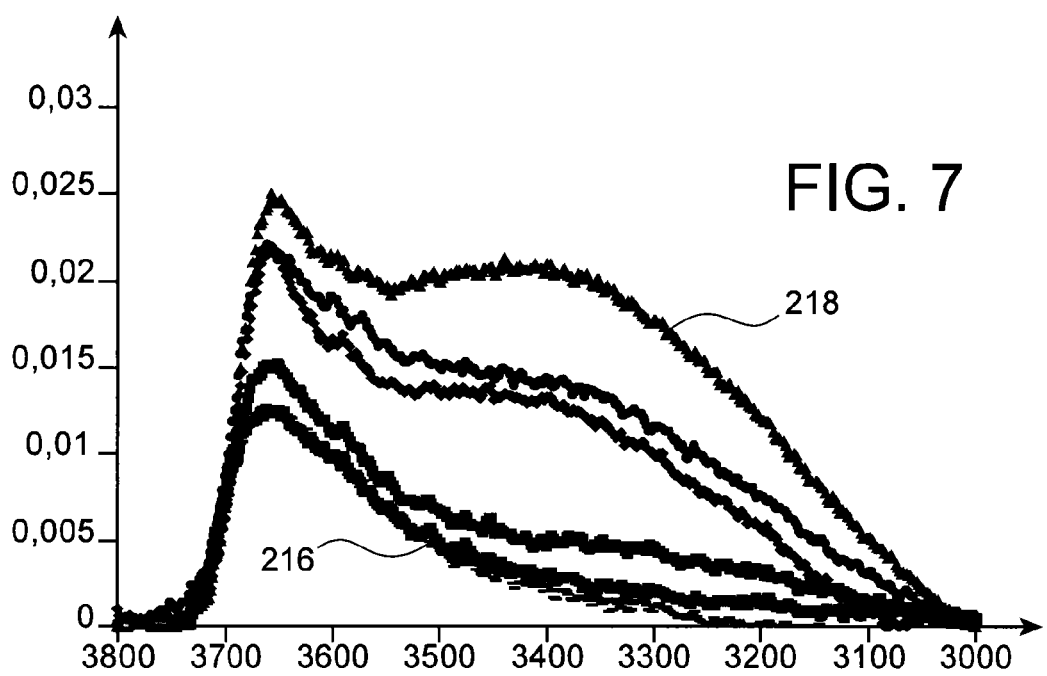
FIG. 7 represents forced diffusion characterisation measurements of water in a material layer obtained using a treatment method, according to the present invention.

This absorbance is representative of the quantity of OH molecules in the oxide layer 104. A surface energy in the region of 0.6 $J/m^2$ is obtained immediately after deposition, and a surface energy in the region of 1.25 $J/m^2$ is obtained after water diffusion in the layer 104. The other curves shown in FIG. 7 correspond to the same absorbance measured during the treatment carried out.

The invention claimed is:

1. A method for treating at least one first material layer including siloxane bonds, wherein at least one surface of the first material layer is configured to be interlocked with a surface of a second material layer by direct bonding, the method comprising:
   at least one forced diffusion at a temperature greater than or equal to 30° C., at least in the first material layer, of chemical species comprising at least one pair of free electrons and at least one labile proton; and
   converting at least one portion of the siloxane bonds into silanol bonds in at least one portion of the first material layer extending from the surface to a depth greater than or equal to approximately 10 nm.

2. The method according to claim 1, wherein the diffused chemical species comprise at least one of $H_2O$, $N_2H_4$, and $NH_4OH$ type molecules.

3. The method according to claim 1, wherein the forced diffusion comprises dipping of the first material layer in a liquid comprising the chemical species.

4. The method according to claim 3, wherein the liquid is water and is heated to a temperature greater than or equal to approximately 30° C.

5. The method according to claim 3, wherein, when dipping the first material layer in the liquid, the liquid is water and is heated to a temperature greater than or equal to approximately 70° C., the first material layer being dipped in the liquid for a time greater than or equal to approximately 1 hour.

6. The method according to claim 1, wherein the forced diffusion comprises exposure of the first material layer to an atmosphere comprising the chemical species in gaseous form.

7. The method according to claim 6, wherein the atmosphere comprises a humidity level greater than or equal to approximately 70% and the exposure is carried out at a temperature greater than approximately 50° C.

8. The method according to claim 1, wherein the forced diffusion is implemented at a pressure greater than atmospheric pressure.

9. The method according to claim 8, wherein the forced diffusion comprises dipping of the first material layer in a liquid comprising the chemical species and heated to a temperature greater than or equal to 100° C.

10. The method according to claim 1, wherein the material of the first layer is a silicon oxide obtained using a deposition on a substrate comprising semiconductor or a thermal oxidation of the substrate.

11. A method for interlocking at least one first material layer comprising siloxane bonds against at least one second material layer, comprising:
   using a method for treating the at least one first material layer according to claim 1;
   direct bonding the first material layer against the second material layer.

12. The method according to claim 11, further comprising a chemical-mechanical planarization of the surfaces of the first and second material layer which are configured to be placed in contact against each other during the direct bonding, carried out before the direct bonding.

13. A method for interlocking at least one first material layer comprising siloxane bonds against at least one second material layer, comprising:
   using a method for treating the at least one first material layer and the second material layer according to claim 1; and
   direct bonding the first material layer against the second material layer.

* * * * *